United States Patent
Erlbacher et al.

(10) Patent No.: US 10,957,684 B2
(45) Date of Patent: Mar. 23, 2021

(54) RC-SNUBBER ELEMENT WITH HIGH DIELECTRIC STRENGTH

(71) Applicant: FRAUNHOFER-GESELLSCHAFT ZUR FOERDERUNG DER ANGEWANDTEN FORSCHUNG E.V., Munich (DE)

(72) Inventors: Tobias Erlbacher, Erlangen (DE); Andreas Schletz, Erlangen (DE); Gudrun Rattmann, Erlangen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/687,938

(22) Filed: Nov. 19, 2019

(65) Prior Publication Data
US 2020/0168597 A1    May 28, 2020

(30) Foreign Application Priority Data
Nov. 22, 2018   (DE) ............... 10 2018 219 994.9

(51) Int. Cl.
| | |
|---|---|
| *H01L 27/02* | (2006.01) |
| *H01L 27/06* | (2006.01) |
| *H02H 9/00* | (2006.01) |
| *H02H 9/04* | (2006.01) |
| *H02H 7/125* | (2006.01) |

(52) U.S. Cl.
CPC ...... *H01L 27/0248* (2013.01); *H01L 27/0676* (2013.01); *H02H 7/1252* (2013.01); *H02H 9/001* (2013.01); *H02H 9/04* (2013.01); *H02H 9/042* (2013.01); *H02H 9/043* (2013.01); *H02H 9/046* (2013.01)

(58) Field of Classification Search
CPC ............ H01L 27/0248; H01L 27/0676; H01L 29/66666; H01L 29/66712; H01L 29/7811; H01L 29/7827; H02H 9/001; H02H 3/20; H02H 7/1252; H02H 9/04; H02H 9/042; H02H 9/043; H02H 9/046
See application file for complete search history.

(56) References Cited

U.S. PATENT DOCUMENTS

| | | | |
|---|---|---|---|
| 7,738,226 B2 | 6/2010 | Berberich et al. | 361/91.7 |
| 9,917,146 B2 | 3/2018 | Bauer et al. | H01L 28/60 |

(Continued)

*Primary Examiner* — Feifei Yeung Lopez
(74) *Attorney, Agent, or Firm* — Renner Kenner Greive Bobak Taylor & Weber

(57) ABSTRACT

In an electrical circuit arrangement, which is formed by an RC-snubber element monolithically integrated into a semiconductor substrate, a first capacitor and a resistor of the RC-snubber element are vertically formed in a semiconductor region of a first type of doping of the semiconductor substrate. At least one further capacitor is connected in series with the first capacitor. The further capacitor is integrated laterally with the first capacitor in a semiconductor region of a second type of doping, which adjoins the semiconductor region of the first type of doping, and by virtue of the different type of doping electrically insulates the further capacitor from the semiconductor region of the first type of doping. This circuit arrangement forms a low inductance RC-snubber element with high dielectric strength, which has high heat dissipation and integration density.

9 Claims, 6 Drawing Sheets

(56) References Cited

U.S. PATENT DOCUMENTS

| | | | |
|---|---|---|---|
| 2003/0222327 A1* | 12/2003 | Yamaguchi | H01L 29/7802 257/500 |
| 2008/0017920 A1 | 1/2008 | Sapp et al. | 257/330 |
| 2010/0163950 A1* | 7/2010 | Gladish | H01L 29/7835 257/302 |
| 2015/0145104 A1 | 5/2015 | Baur et al. | H01L 28/82 |
| 2016/0118380 A1 | 4/2016 | Lui et al. | H01L 27/0629 |
| 2017/0287903 A1* | 10/2017 | Lui | H01L 27/0629 |

* cited by examiner

RC-SNUBBER ELEMENT WITH HIGH DIELECTRIC STRENGTH

TECHNICAL FIELD OF APPLICATION

The present invention concerns an electrical circuit arrangement consisting of an RC-snubber element monolithically integrated into a semiconductor substrate, in which a first capacitor and a resistor of the RC-snubber element are formed vertically in a semiconductor region of a first type of doping of the semiconductor substrate, and at least one further capacitor is connected in series with the first capacitor.

Snubber elements are used in electrical circuits to attenuate disturbing high frequencies or voltage peaks, such as occur, for example, when switching inductive loads. So-called RC-snubber elements, which are formed by a series circuit of a capacitor with a resistor, are often used for this purpose. Low-inductance snubber elements, with good heat dissipation and high dielectric strength, are required for use in power electronics.

PRIOR ART

The monolithic integration of a vertical RC-snubber element into a semiconductor substrate enables high heat dissipation. Such an RC-snubber element is described, for example, in U.S. Pat. No. 7,738,226 B2. The capacitor of this RC-snubber element is formed by a trench structure in a semiconductor substrate, which is coated with a dielectric layer and filled with an electrically conductive material. A doped region between this trench structure and the rear face of the substrate forms the resistance of the RC-snubber element. Contact can be made with the RC-snubber element by means of suitable contact metallisation on the front and rear faces. The RC-snubber chip thereby obtained can, for example, be mounted on a DCB-substrate (DCB: direct copper bonding). However, a high dielectric strength for such a RC-snubber element of 1200V, for example, requires a very thick dielectric, with the associated problems of mechanical stresses.

A series circuit of two RC-snubber elements on a DOB-substrate would indeed reduce the voltage load on each RC-snubber element by half. However, this requires two bonding points on the upper face and thus leads to an increased inductance. Moreover, such an arrangement requires additional surface space as a result of the air gap required between the individual components.

The voltage loading of capacitors can be reduced by connecting a plurality of capacitors in series. Thus, for example, U.S. Pat. No. 9,917,146 B2 proposes a vertical arrangement of monolithically integrated capacitors, in which the first capacitor is designed as a trench structure on the front face of the semiconductor substrate, and the second capacitor is designed as a trench structure on the rear face of the semiconductor substrate. Such an implementation is possible by means of double-sided processing of the semiconductor substrate. However, in this case the rear face potential does not correspond to the substrate potential. For modular construction, such a design also requires increased insulation complexity.

The object of the present invention is to specify an electrical circuit arrangement consisting of an RC-snubber element that has a low inductance, with good heat dissipation, high dielectric strength, and a high integration density.

PRESENTATION OF THE INVENTION

The object is achieved with the electrical circuit arrangement according to patent claim 1. Advantageous designs of the circuit arrangement are the subject matter of the dependent patent claims, or can be found in the following description, as well as in the example of embodiment.

In the proposed electrical circuit arrangement, the RC-snubber element is integrated into a semiconductor substrate, wherein a first capacitor and the resistor of the RC-snubber element are vertically formed in a semiconductor region of a first type of doping of the semiconductor substrate. At least one further capacitor is connected in series with the first capacitor. This further capacitor is integrated laterally with the first capacitor in a semiconductor region of a second type of doping, which is adjacent to the semiconductor region of the first type of doping. By virtue of the different types of doping, this further capacitor is electrically insulated via a pn-junction from the semiconductor region of the first type of doping, and thus from the resistance of the RC-snubber element.

The proposed electrical circuit arrangement is thus characterised by a combination of a vertical and at least one lateral capacitor in the semiconductor substrate, so that only one bonding wire is required for the front face contact. This leads to a low inductance of this circuit arrangement, operating as an RC-snubber element. By virtue of the monolithic integration of just one vertical RC-snubber, thermal losses continue to be dissipated via the semiconductor substrate, so that good heat dissipation from the circuit arrangement is ensured. The resistance of the RC-snubber element can also still be adjusted by way of the doping between the first capacitor and the rear face of the semiconductor substrate in the semiconductor region of the first type of doping. The rear face potential on the metallisation applied to the rear face for purposes of making contact with the resistor corresponds to the substrate potential.

By the arrangement of a further capacitor as a lateral capacitor, the blocking voltage of the electrical circuit arrangement is divided among a plurality of capacitors. This enables a thinner dielectric to be deployed in the capacitors, so that less mechanical stress also occurs. Thus the dielectric can preferably have a thickness between 500 nm and 2000 nm, in order to achieve a dielectric strength between about 400V and about 2000V with a series circuit of the vertical capacitor with a lateral capacitor. For example, a layer thickness of 20 nm $SiO_2$ and 500 nm $Si_3N_4$ produces a dielectric strength of 400V, a layer thickness of 330 nm $SiO_2$ and 1000 nm $Si_3N_4$ produces a dielectric strength of 1200 V, and a layer thickness of 330 nm $SiO_2$ and 1500 nm $Si_3N_4$ produces a dielectric strength of 1800 V. With more than one lateral capacitor, the required layer thickness is reduced accordingly. With a constant layer thickness, the dielectric strength increases accordingly.

The insulation of the one or a plurality of lateral capacitors is achieved by pn-junctions, which operate as diodes in the blocking direction if the polarity of the electrical voltage on the RC-snubber element is suitable. Here the pn-junction between the semiconductor regions of the different types of doping must only block about 50% of the applied voltage. The proposed circuit arrangement also enables a higher integration density compared to a design with only one capacitor and the same dielectric strength, for which, due to a thicker dielectric, only a smaller hole depth is possible, and thus a larger surface area is required for the same capacitance.

In the preferred design, the semiconductor region of the second type of doping, in which the further capacitor is formed, is formed as a well region in the semiconductor region of the first type of doping. If a plurality of lateral capacitors are connected in series, a plurality of separate well regions of the second type of doping are then preferably formed in the semiconductor region of the first type of doping.

The semiconductor region of the first type of doping preferably extends from the front face of the semiconductor substrate, on which the capacitors are formed, to the rear face of the semiconductor substrate. The rear face is provided with metallisation on the rear face, by way of which electrical contact can be made with the resistor of the RC-snubber element. At least one electrical contact is applied to the front face, by way of which electrical contact can be made with at least the further capacitor, or—in the case of a plurality of further capacitors—the last capacitor of the series circuit.

In the proposed circuit arrangement, the capacitors are preferably each formed in the manner of known art by an arrangement of recesses in the front face of the semiconductor substrate; these are coated with an electrically insulating dielectric layer, or layer sequence, and are filled with an electrically conductive material. The recesses can, for example, be designed as trenches running side by side, in particular in a parallel arrangement, or also in a concentric arrangement. Hole structures in an hexagonal arrangement are preferably used as recesses. Other geometries are also possible, such as recesses of rectangular cross-section on the surface. Here all the capacitors preferably have a common dielectric, or a common dielectric layer, or layer sequence. This dielectric can be formed, for example, from silicon dioxide and silicon nitride.

In the proposed circuit arrangement, balancing resistors between the capacitors can be formed as either ohmic or non-linear resistors (further diode structures) in order to balance the leakage currents of the pn-diodes formed by the pn-junctions. Furthermore, a junction termination for the blocking pn-junction can be formed around each of the well regions for the other capacitors.

The semiconductor regions in the region of the capacitors are preferably sufficiently highly doped so as to achieve a low ESR (ESR: equivalent series resistance).

The proposed circuit arrangement can be used very advantageously for voltage attenuation and for similar applications of RC-snubber elements in power electronics. As a semiconductor chip, it can easily be mounted on power semiconductor substrates, in particular on DCB-substrates. By virtue of the large thermal contact area over the rear face of the semiconductor chip, very good heat dissipation is achieved.

BRIEF DESCRIPTION OF THE DRAWINGS

In what follows the proposed electrical circuit arrangement is explained in more detail by way of examples of embodiment, in conjunction with the figures. Here.

WAYS FOR CARRYING OUT THE INVENTION

Figure 1:
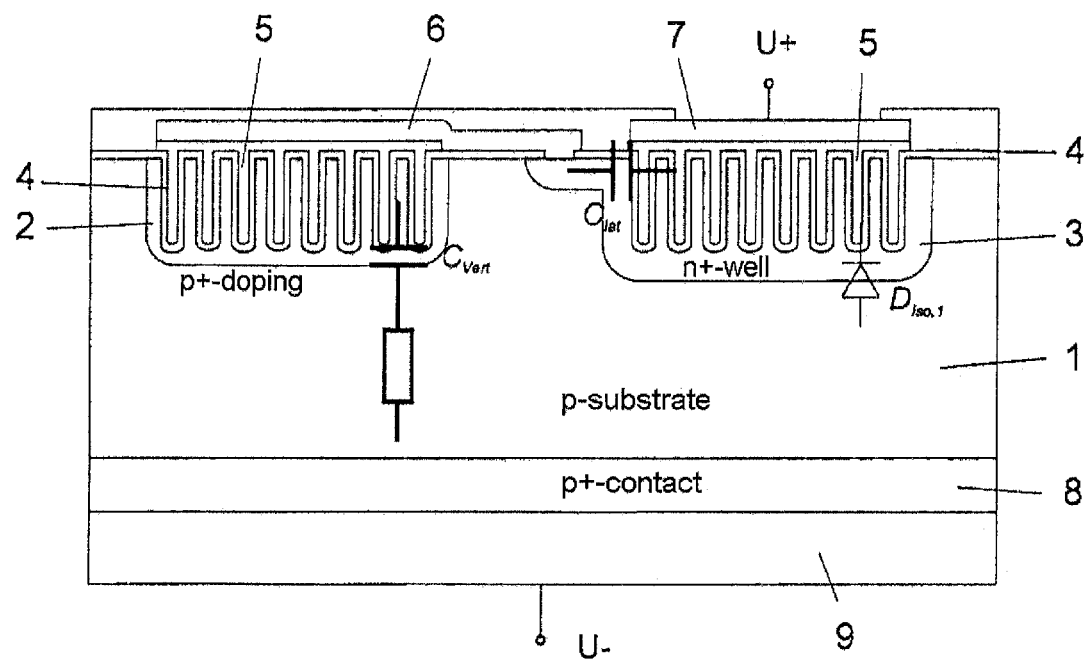
FIG. 1 shows a cross-section through an electrical circuit arrangement, and an equivalent circuit diagram, in accordance with a first example of embodiment of the present invention.
Figure 1:
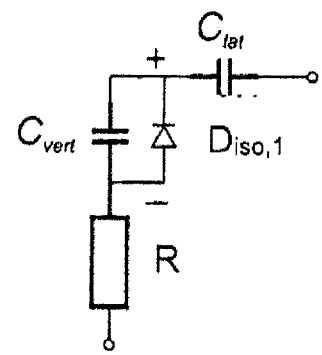

In what follows, the proposed electrical circuit arrangement is described in more detail with the aid of a plurality of examples of embodiment, in which the RC-snubber element with the vertical capacitor, and one or a plurality of lateral capacitors, is designed as a semiconductor chip. To this end FIG. 1 shows a cross-sectional presentation of a first example of embodiment, together with a corresponding equivalent circuit diagram of this design. The RC-snubber element is formed by a series circuit of a resistor R, a vertical capacitor $C_{vert}$, and a lateral capacitor $C_{lat}$, as shown in the equivalent circuit diagram. For this purpose, a p$^+$-doped well 2 and an n$^+$-doped well 3 are introduced into the front face of the p-doped semiconductor substrate 1. In these wells trenches are formed, which are coated with a dielectric layer 4 and filled with an electrically conductive material 5, such as polysilicon. The two capacitors formed in this way are connected in series via metallisation 6, wherein electrical contact can be made with the lateral capacitor $C_{lat}$ via a corresponding front face electrode 7. A p$^+$-layer is located on the rear face of the semiconductor substrate 1 to form a p$^+$-contact 8, to which rear face metallisation 9 is applied. This rear face metallisation forms the rear face electrode for purposes of making contact with the RC-snubber element. By virtue of the n$^+$-doping of the well region 3 of the lateral capacitor $C_{lat}$, a pn-diode $D_{iso,1}$ is formed, as shown in the equivalent circuit diagram. The individual components of this equivalent circuit diagram are also indicated in the cross-sectional presentation. The polarity of the capacitors is determined by a reverse polarity of the pn-diode $D_{iso,1}$. By virtue of the p-doping of the semiconductor substrate 1 and the thickness of this substrate, the magnitude of the resistor R is specified and can be adjusted.

Figure 2:
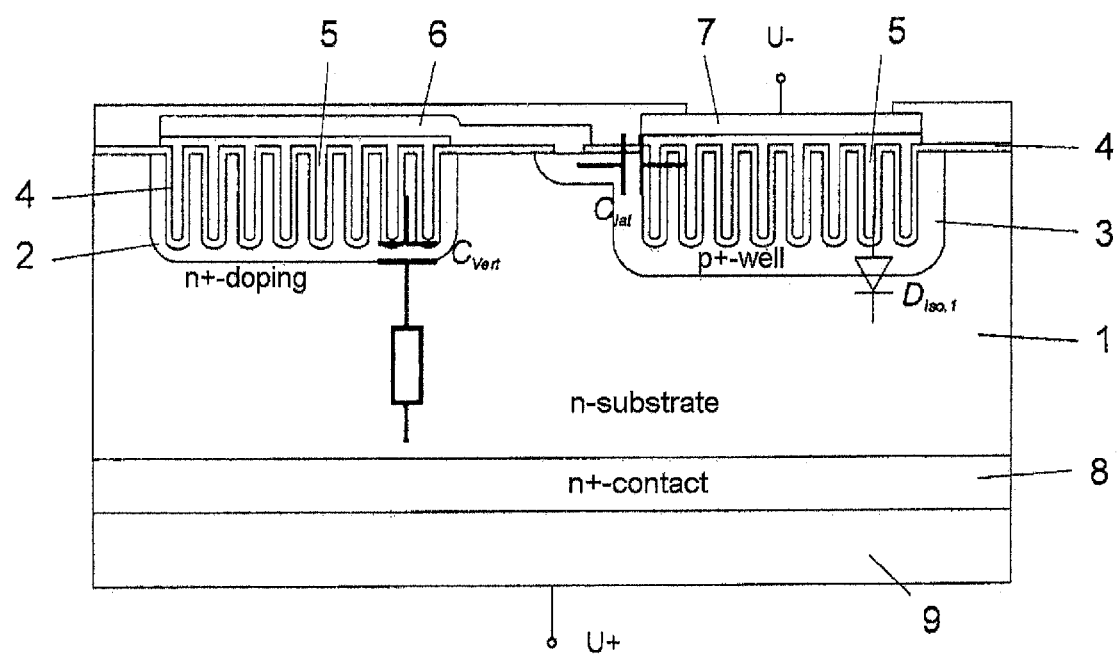
FIG. 2 shows a cross-section through an electrical circuit arrangement, and an equivalent circuit diagram, in accordance with a second example of embodiment of the present invention.

Such an electrical circuit arrangement can also be implemented with dopings that are inverted compared to FIG. 1, as is shown schematically in FIG. 2 in a cross-sectional presentation, as well as in the corresponding equivalent circuit diagram.

Figure 3:
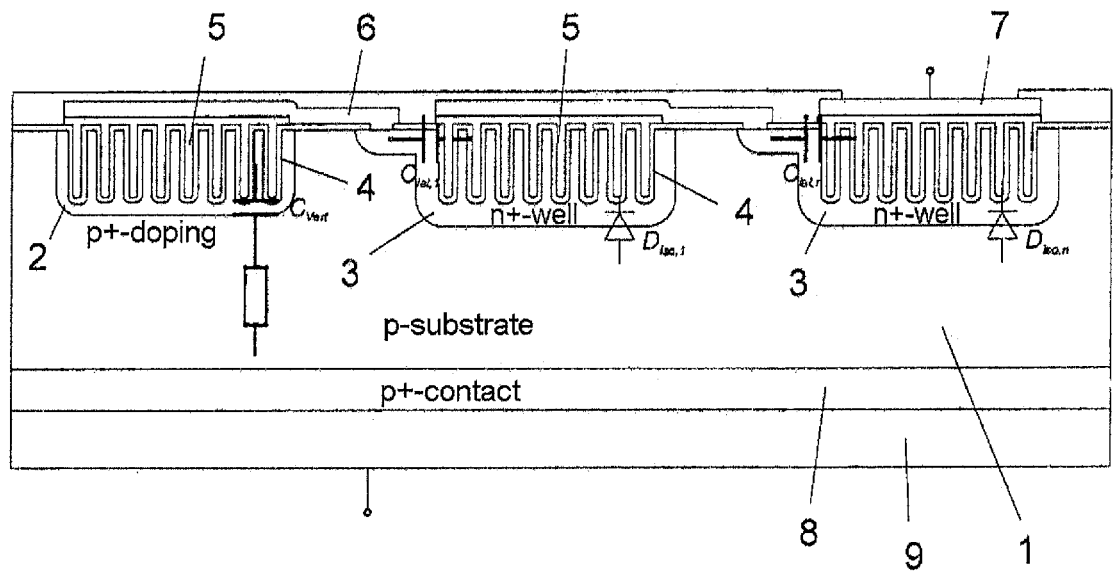
FIG. 3 shows a cross-section through an electrical circuit arrangement, and an equivalent circuit diagram, in accordance with a third example of embodiment of the present invention.
Figure 3:
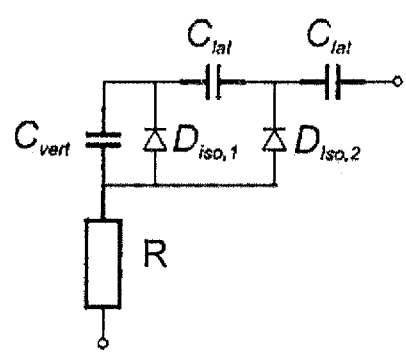

The proposed electrical circuit arrangement can also be implemented with more than one lateral capacitor. In this case, a plurality of lateral capacitors $C_{lat}$ are connected in series with the vertical capacitor $C_{vert}$, as illustrated by the two lateral capacitors $C_{lat}$ in FIG. 3. Here the second lateral capacitor is formed in the same way as the first lateral capacitor in an n$^+$-doped well 3 in the semiconductor substrate. Here too, the individual capacitors are connected by way of appropriate metallisations 6. The blocking resistance of the pn-diode $D_{iso,2}$, or $D_{iso,n}$ of the last lateral capacitor in the series circuit, must be sufficiently high to withstand the voltages that occur.

Figure 4:
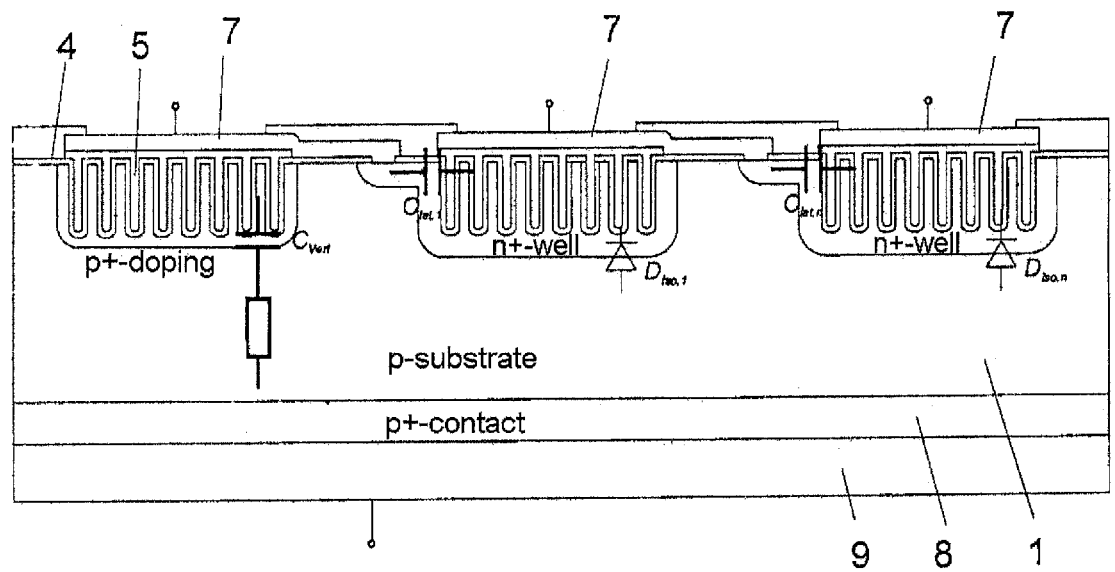
FIG. 4 shows a cross-section through an electrical circuit arrangement, and an equivalent circuit diagram, in accordance with a fourth example of embodiment of the present invention.
Figure 4:
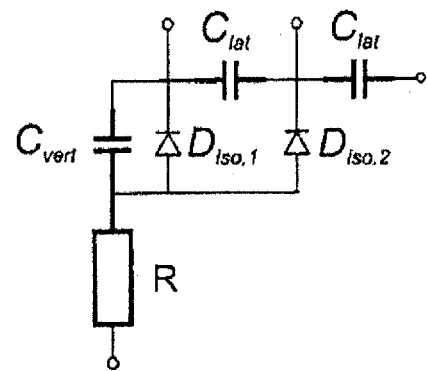

Instead of making contact with just the last capacitor in the series circuit, each capacitor $C_{vert}$, $C_{lat}$ can also be provided with a corresponding contact electrode 7, as shown, for example, in the cross-sectional presentation and the equivalent circuit diagram of FIG. 4. This option of making contact with the individual capacitors makes it possible, for example, to implement a charge pump or a capacitive voltage divider. Here the individual capacitors can also have different capacitance values.

Figure 5:
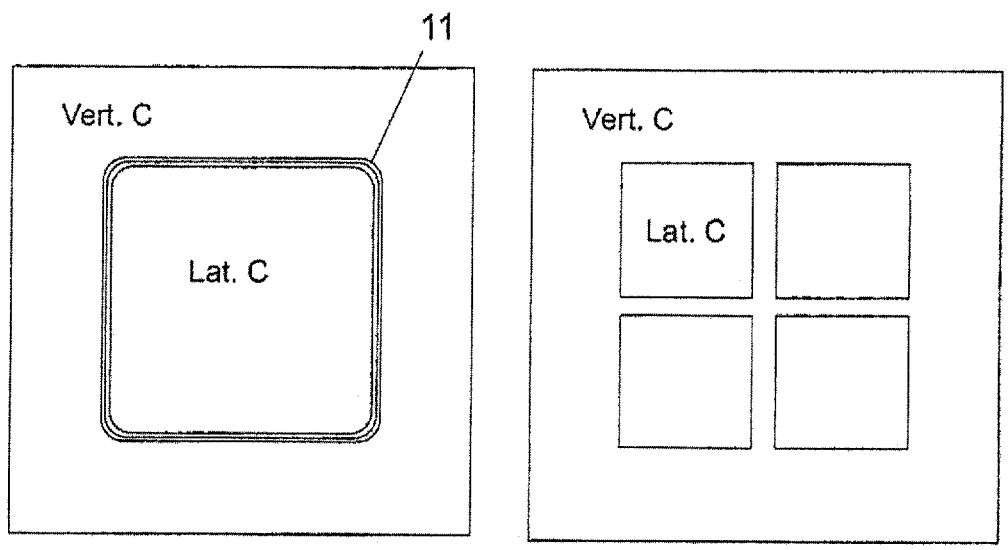
FIG. 5 shows two examples of the arrangement of the vertical and one or a plurality of lateral capacitors in a plan view onto the electrical circuit arrangement in accordance with the present invention.

The individual capacitors can be arranged laterally in different ways. To this end FIG. 5 shows two examples of such an arrangement, highly schematised, in a plan view onto the semiconductor substrate. In the left-hand design with only one lateral capacitor $C_{lat}$, this is symmetrically arranged within the region of the vertical capacitor $C_{vert}$. In this figure, a junction termination 11 is also indicated, which is intended to prevent any breakthrough on the curvatures of the well for the lateral capacitor. The junction termination represents a barrier layer insulation of the pn-diodes with the aid of field rings. In the right-hand part of the figure an example of a design with four lateral capacitors is indicated.

Figure 6:
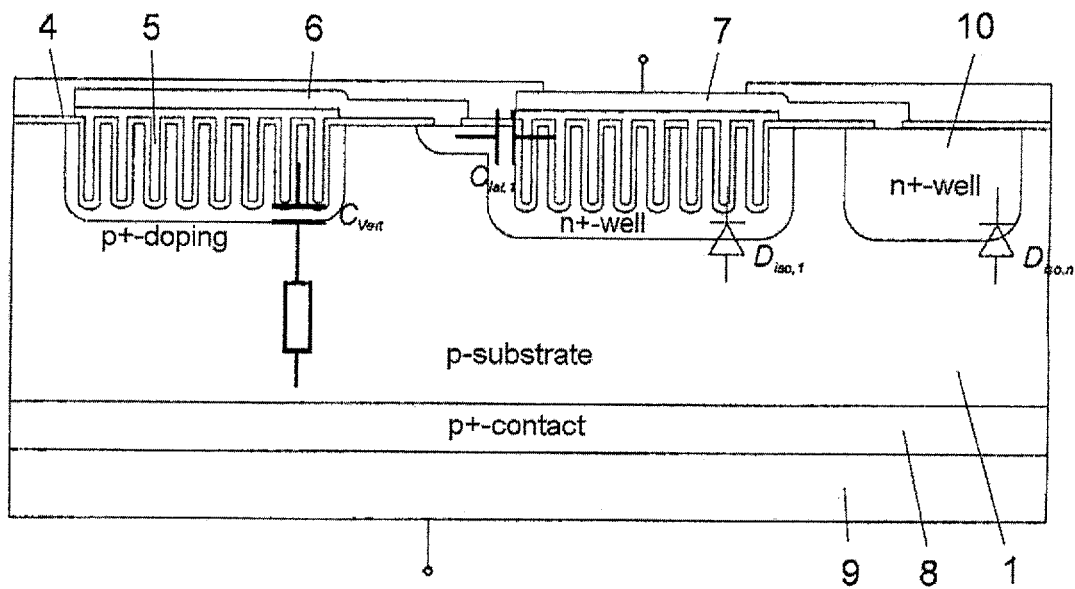
FIG. 6 shows a cross-section through an electrical circuit arrangement, and an equivalent circuit diagram, in accordance with a fifth example of embodiment of the present invention.
Figure 6:
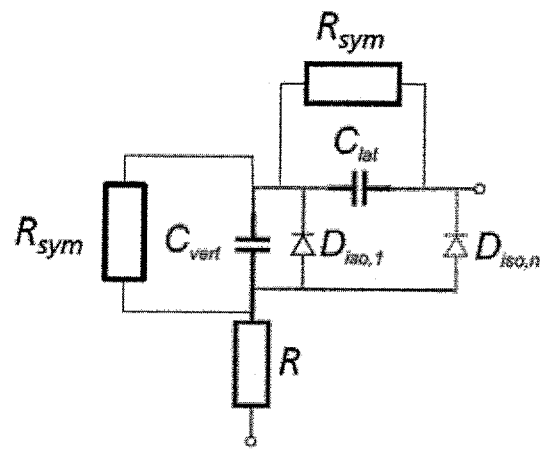

Finally, FIG. 6 shows another example of embodiment of the proposed electrical circuit arrangement, in which an additional n$^+$-well 10 is introduced into the semiconductor substrate 1 so as to generate an additional pn-diode $D_{iso,n}$. A series circuit of appropriate Zener diodes for high voltages for balancing purposes is also possible with the proposed circuit arrangement. The layout of the leakage currents of the individual pn-diodes can take place by way of the respective component areas. The introduction of additional poly resistors ($R_{sym}$ and $R_{sym}$) between the individual capacitors is also possible for balancing purposes.

The blocking resistance of the respective pn-diode can be adjusted by way of the doping and the width of the drift region (substrate thickness). Here a vertical extent corresponding to a substrate thickness of >200 μm is preferred. The lateral extent, that is to say, the distances between the individual capacitors in the lateral direction, can be <200 μm if the doping is suitably adjusted to avoid a PT-effect.

The following table gives an example of the possible resistance range (respective minimum resistance) for different voltages with a substrate thickness of 650 μm.

| | R in Ωcm$^2$ | | | | | | | | |
|---|---|---|---|---|---|---|---|---|---|
| | 0.03 | 0.07 | 0.16 | 0.7 | 1.2 | 1.8 | 2.9 | 4.2 | 6.8 |
| $U_{max}$ in V | 50 | 100 | 200 | 600 | 900 | 1200 | 1700 | 2300 | 3300 |

Lower resistances are also possible with the aid of correspondingly thinner substrates or epitaxy.

Figure 7A:
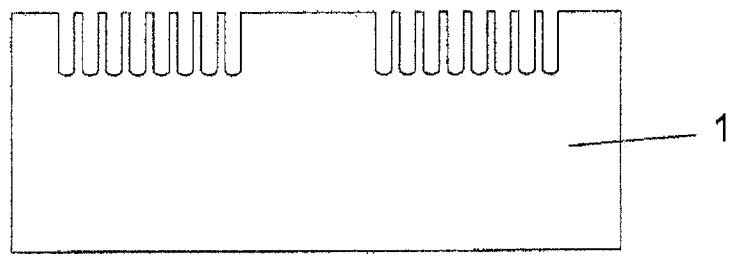
FIGS. 7A-D show an exemplary sequence of the steps in the method for the production of the proposed electrical circuit arrangement in a cross-sectional presentation.
Figure 7B:
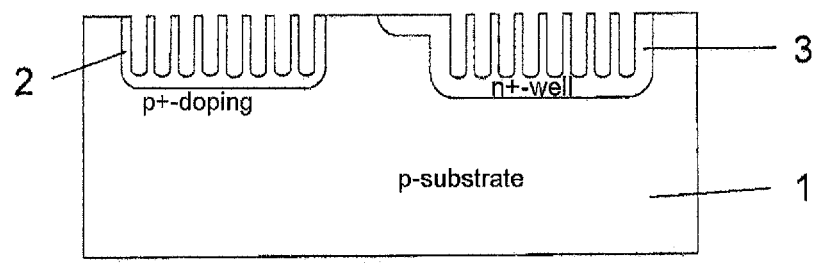
Figure 7C:
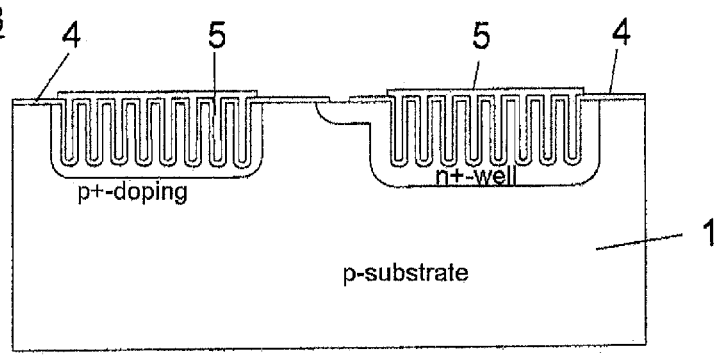
Figure 7D:
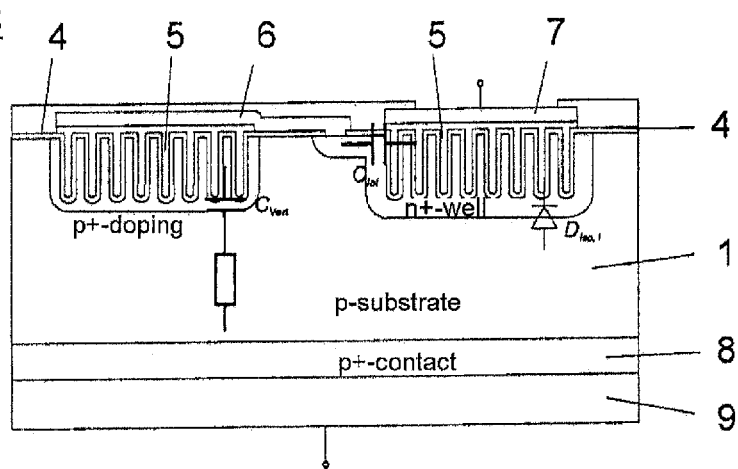

In what follows an example of the production of an inventive electrical circuit arrangement with a vertical and a lateral capacitor as shown in FIG. 1 is briefly explained. First, a trench structure is created in the surface of the substrate 1 for each of the two capacitors with the aid of a mask. This serves to increase the surface area for the formation of capacitors and in the case of a silicon substrate can be done, for example, by means of dry etching (anisotropic). FIG. 7A shows an appropriate trench structure of the p-doped semiconductor substrate 1. This is followed by doping of the capacitor regions so as to generate the respective wells 2, 3. The well 2 for the vertical capacitor is p$^+$-doped, for example by B-implantation or boron glass deposition. The n$^+$-doping of the well 3 for the lateral capacitor can take place, for example, by means of P-implantation or POCl$_3$-deposition. Annealing then takes place, during which the dopants are activated and the surface concentration is reduced. FIG. 7B shows the result of this doping step in cross-section. Implantation of a junction termination for the n$^+$-doped well 3 is also possible. The next step is the deposition of the capacitor dielectric 4, and the filling of the trenches with polysilicon 5, as is schematically indicated in FIG. 7C. The capacitor dielectric 4 is created by thermal oxidation in combination with a silicon nitride deposition. There then follows the polysilicon deposition (e.g. doped in-situ) and the structuring of the deposited layer. Finally, contact holes are etched in to enable electrical contacts to be subsequently made. FIG. 7D shows the final electrode production and passivation. The front face is first metallised in conjunction with a structuring of the metal 6 and the polysilicon 5. This is followed by the metallisation of the rear face and the deposition of a passivation layer, for example using polyimide. The result is an electrical circuit arrangement as has been described in FIG. 1.

LIST OF REFERENCE SYMBOLS

1 Semiconductor substrate
2 Well for vertical capacitor
3 Well for lateral capacitor
4 Dielectric layer
5 Electrically conductive material
6 Metallisation
7 Contact electrode
8 p$^+$-contact or n$^+$-contact
9 Rear face metallisation
10 n$^+$-doped well
11 Junction termination

The invention claimed is:

1. An electrical circuit arrangement, which is formed by an RC-snubber element, which is monolithically integrated into a semiconductor substrate, in which
   a first capacitor ($C_{vert}$) and a resistor (R) of the RC-snubber element are formed vertically in a semiconductor region of a first type of doping of the semiconductor substrate, and
   at least one further capacitor ($C_{lat}$) is connected in series with the first capacitor ($C_{vert}$),
   wherein the further capacitor ($C_{lat}$) is integrated laterally in a semiconductor region of a second type of doping, which adjoins the semiconductor region of the first type of doping, and, by virtue of the different type of doping, electrically insulates the further capacitor ($C_{lat}$) from the semiconductor region of the first type of doping.

2. The electrical circuit arrangement in accordance with claim 1, characterised in that,
   the semiconductor region of the second type of doping is formed as a well region in the semiconductor region of the first type of doping.

3. The electrical circuit arrangement in accordance with claim 1, characterised in that,
   the semiconductor region of the first type of doping extends from a front face of the semiconductor substrate, on which the capacitors ($C_{vert}$, $C_{lat}$) are formed, to a rear face of the semiconductor substrate, wherein the rear face is provided with a rear face metallisation, by way of which electrical contact can be made with the resistor (R) of the RC-snubber element, and at least one electrical contact is applied to the front face, by way of which electrical contact can be made with the at least one further capacitor ($C_{lat}$).

4. The electrical circuit arrangement in accordance with claim 3, characterised in that, the semiconductor substrate for forming the capacitors ($C_{vert}$, $C_{lat}$) on the front face has in each case an arrangement of recesses, which are coated with an electrically insulating dielectric layer, or layer sequence, and are filled with an electrically conductive material.

5. The electrical circuit arrangement in accordance with claim 4, characterised in that, the capacitors ($C_{vert}$, $C_{lat}$) have a common electrically insulating dielectric layer, or layer sequence.

6. The electrical circuit arrangement in accordance with claim 4, characterised in that, the electrically insulating dielectric layer, or layer sequence, is formed from silicon dioxide and silicon nitride.

7. The electrical circuit arrangement in accordance with claim 1, characterised in that, balancing resistors are formed between the capacitors ($C_{vert}$, $C_{lat}$).

8. The electrical circuit arrangement in accordance with claim 2, characterised in that, a junction termination is formed around the well region.

9. The electrical circuit arrangement in accordance with claim 1, characterised in that, the semiconductor regions in the area of the capacitors ($C_{vert}$, $Q_{lat}$) have a doping of $\geq 5E18$ cm$^{-3}$.

\* \* \* \* \*